United States Patent [19]
Frentzel et al.

[11] Patent Number: 5,139,819
[45] Date of Patent: Aug. 18, 1992

[54] FAST CURING AND STORAGE STABLE THERMOSET POLYMER THICK FILM COMPOSITIONS

[75] Inventors: Richard L. Frentzel, Chino Hills; Warren R. Oakdale, Upland, both of Calif.

[73] Assignee: Advanced Products, Inc., Cheshire, Conn.

[21] Appl. No.: 737,299

[22] Filed: Jul. 29, 1991

Related U.S. Application Data

[62] Division of Ser. No. 510,382, Apr. 17, 1990, Pat. No. 5,057,245.

[51] Int. Cl.$^5$ .............................................. B05D 3/06
[52] U.S. Cl. ......................................... 427/55; 427/96; 427/121; 427/282
[58] Field of Search ............. 252/511; 427/121, 385.5, 427/55, 96, 282

[56] References Cited

U.S. PATENT DOCUMENTS 4,704,231  11/1987  Chung ................................. 252/511
4,971,726  11/1990  Maeno et al. ................... 524/496 X

OTHER PUBLICATIONS

Hoechst Celanese Product Bulletin on Poly(p-hydroxystyrene).
American Cyanamid Product Bulletin on CYMEL 303 Resin.

Primary Examiner—Michael Lusignan
Attorney, Agent, or Firm—William A. Simons

[57] ABSTRACT

A thermally curable polymer thick film compositions comprising, by weight:
(a) about 3-15 parts of at least one poly(hydroxystyrene) resin;
(b) a crosslinking resin selected from the group consisting of:
  (i) about 5-25 parts of at least one blocked isocyanate resin; or
  (ii) about 2-10 parts of at least one melamine-formaldehyde resin;
(c) an effective amount of at least one organic solvent capable of substantially dissolving (a) and (b) ingredients;
(d) conductive particulate matter selected from the group consisting of:
  (i) about 50-80 parts silver flake;
  (ii) a graphite/carbon black mixture consisting of:
    (aa) about 15-45 parts graphite; and
    (bb) about 1-10 parts carbon black; or
  (iii) a mixture of (i) and (ii).

19 Claims, No Drawings

FAST CURING AND STORAGE STABLE THERMOSET POLYMER THICK FILM COMPOSITIONS

This application is a division of application Ser. No. 07/510,382 filed Apr. 17, 1990, now U.S. Pat. No. 5,057,245.

BACKGROUND OF THE INVENTION

1. Field of the Invention

The present invention relates to selected curable and cured thermoset polymer thick film (PTF) compositions and their use, when cured, as electronic circuitry and the like.

More particularly, this invention relates to selected single-component curable PTF compositions that have a relatively long shelf life at room temperature (i.e., more than six months) and are curable in an infrared oven at relatively high temperatures and short times (e.g., at about 180° C.–250° C. for less than about 10 minutes) on a wide variety of substrates (e.g., phenolic paper-type printed wiring boards). Still further, this invention relates to selected cured PTF compositions which exhibited good flexibility, have good abrasion and solvent resistance, have acceptably good adhesion to a substrate as well as are stable at high temperatures (e.g., about 300° C.) for short periods of time. And further, the present invention relates to a process of curing such PTF compositions.

2. Brief Description of the Prior Art

Thermoset polymer thick films have been used as screen-printed electronic circuitry on a substrate material for various electronic applications such as jumpers on printed wiring boards, key pads for computers and typewriters, and the like. These prior art polymer thick film compositions preferred to use thermoset polymers in them rather than thermoplastic polymers because the former are more solvent resistant as well as high temperature stable. The latter property is particularly needed when the PTF-coated substrate is subjected to a high temperature solder bath (i.e., about 300° C. for up to 30 seconds) after the PTF application step.

Prior art thermoset PTF compositions have generally consisted of epoxy resin or mixture of resins, a curative (e.g., DICY), and a catalyst (e.g., urea). Presently, the commercially available thermoset PTF compositions exhibit either a long shelf life at room temperature (i.e., over six months) and require a high temperature cure (i.e., about 160° C. or higher for 30–60 minutes) or exhibit a short shelf life (i.e., about two to three weeks) and a lower temperature cure (i.e., about 125°–140° C. for 30–60 minutes) in a convection oven.

Ideally, a thermoset PTF composition should possess the following combination of properties:

(1) exhibit a relatively long shelf life at room temperature (i.e., at least six months);
(2) require a low curing temperature and short curing times in a convection oven (i.e., no higher than 125° C. to 140° C. for no longer than 60 minutes); as well as be curable in an infrared oven at higher temperatures (i.e., 180° C. to 250° C.) for very short times (e.g., less than 10 minutes).
(3) be sufficiently conductive (or have low electrical resistivity) to carry an electric current;
(4) be sufficiently flexible when cured to be applied to flexible substrate (or substrates which might flex during their operation);
(5) have good abrasion resistance when cured so that they do not easily get rubbed or scratched off the substrate;
(6) have acceptably good adhesion to the substrate when cured;
(7) be stable at relatively high temperatures (at about 300° C.) for short period of time such as those employed in solder bath treatments;
(8) be easily prepared; and
(9) be inexpensively applied to a substrate and cured without needing a complicated procedure.

One recent alternative class of thermoset PTF composition is disclosed in U.S. Pat. No. 07/403,235, filed on Sep. 5, 1989, now U.S. Pat. No. 5,049,313, patented Sep. 17, 1991, with Richard L. Frentzel as the named inventor. The U.S. patent application is incorporated herein by reference in its entirety. This class of thermoset PTF compositions comprises certain parts by weight of at least one phenoxy resin, at least one blocked isocyanate resin, a particulated electrically conductive material (i.e., silver flake or a mixture of graphite and carbon black), and, optionally, a nonhydrocarbon polar solvent. While members of this particular class of thermoset PTF compositions possess almost all of the above-listed combination of desired properties, those PTF compositions suffer the disadvantage of being unable to be cured on a phenolic paper-type printed wiring board substrates in an infrared oven because the high curing temperature of 235° C. distorted the phenolic paper-type boards.

The PTF compositions of the present invention, unlike those disclosed in the prior patent application, are believed to have all of the desired combination of properties without that disadvantage.

BRIEF SUMMARY OF THE INVENTION

Accordingly, the present invention is directed to a thermally curable thermoset polymer thick film composition comprising, by weight:

(a) about 3–15 parts of at least one poly(hydroxystyrene) resin;
(b) a crosslinking resin selected from the group consisting of:
   (i) about 5–25 parts of at least one blocked isocyanate resin; or
   (ii) about 2–10 parts of at least one melamine-formaldehyde resin;
(c) an effective amount of at least one organic solvent capable of substantially dissolving (a) and (b) ingredients;
(d) conductive particulate matter selected from the group consisting of:
   (i) about 50–80 parts silver flake;
   (ii) a graphite/carbon black mixture consisting of:
      (aa) about 15–45 parts graphite;
      (bb) about 1–10 parts carbon black; or
   (iii) a mixture of (i) and (ii).

Furthermore, the present invention is also directed to a method of preparing a polymer thick film on a substrate comprising the steps of:

(1) providing a polymer thick film composition as defined above;
(2) applying said composition to a substrate; and
(3) curing said composition on said substrate.

Still further, the present invention is directed to cured polymer thick film composition comprising by weight:

(a) a cured resin system comprising a reaction product of:

(i) about 3-15 parts by weight of at least one poly(-hydroxystyrene) resin; and (ii) a crosslinking resin selected from the group consisting of:

(aa) about 5-25 parts by weight of at least one blocked isocyanate resin; or (bb) about 2-10 parts by weight of a melamine-formaldehyde resin.

(b) a particulated electrically conductive material selected from the group consisting of:

(i) about 50-80 parts by weight silver flake;

(ii) a graphite/carbon black mixture of about 15-45 parts by weight graphite and about 1-10 parts by weight carbon black; or (iii) a mixture of (i) and (ii).

And even further, the present invention is directed to a substrate having a cured conductive polymer thick film coating thereon as defined above.

DETAILED DESCRIPTION

As stated above, the present invention encompasses the combination in a curable thermoset polymer thick film composition made up of four different components: a resin system made from two different types of resins, namely, a poly(hydroxystyrene) resin and either a blocked isocyanate resin or melamine-formaldehyde resin; an organic solvent capable of substantially dissolving these resins; and a particulated electrically conductive material which is either silver flake or a mixture of graphite and carbon black or a mixture of all three.

The poly(hydroxystyrene) resin component is preferably a linear poly(p-hydroxystyrene) resin having a molecular weight from about 6,000 to about 250,000. The most preferred poly(para-hydroxystyrene) resins are SN-5773 ($M_w=28,000$); SN-7548 ($M_w=50,000$); and SN-7549 ($M_w=213,000$) available from Hoechst Celanese Corporation of Dallas, Tex. Mixtures of poly(hydroxystyrene) resins may also be used.

The preferred amounts of poly(hydroxystyrene) are from about 4 parts to about 14 parts, most preferably from about 5 to about 13.5 parts by weight added into the curable PTF composition.

The term "blocked isocyanate resin", as used in the present specification and claims, is an isocyanate resin having blocking groups attached to the isocyanate functions in the molecule. Upon heating, in the presence of other reactive species (e.g., poly(hydroxystyrene) resin, the "blocking group" is believed to leave the isocyanates and the free isocyanate function may react with the other reactive species (e.g., the poly(hydroxystyrene) resin. Blocked isocyanate resins are described in greater detail in a paper presented by Potter, T. A.; Rosthauser, J. W.; and Schmelzer, H. G. entitled "Blocked Isocyanates In Coatings" at the Eleventh International Conference in Organic Coatings Science & Technology Jul. 12-16, 1985 Athens, Greece. This paper is incorporated herein by reference in its entirety.

The preferred blocked isocyanate resin is a blocked aliphatic isocyanate made from hexamethylene diisocyanate (HDI). The most preferred blocked isocyanate resin is DESMODUR BL-3175A available from Mobay Corporation of Pittsburgh, Pa. Mixtures of blocked isocyanates may be used, if desired.

The preferred amount of blocked isocyanate resin is from about 7 parts to about 23 parts, most preferably from about 8 to 22, by weight of said blocked isocyanate resin.

The preferred melamine-formaldehyde resin is hexamethoxymethylmelamine and is made from powdered hexamethylolamine, methanol, and hydrochloric acid. The most preferred hexamethoxymethylmelamine product is CYMEL 303 resin available from American Cyanamid Co. of Wayne, N.J. Mixtures of melamine-formaldehyde resins may be used, if desired.

The preferred amount of melamine-formaldehyde resin is from about 3-9 parts by weight added to the curable PTF composition.

The particulated electrically conductive material may be either silver flake or a mixture of graphite and carbon black or a mixture of silver flake, graphite, and carbon black. This conductive material component should provide stable conductivity under a wide variety of environmental conditions and, preferably, should also be capable of forming relatively stable dispersion. The particle size of the particulate conductive material does not have to be in critical narrow range, but should be of a size appropriate to the substrate and end-use for which they are to be applied, which is usually screen printing. Thus, the conductive phase materials should be no bigger than 30 microns ($\mu m$) and preferably should be below about 10 microns. As a practical matter, most available silver flake, graphite, and carbon black particles have average particle sizes less than 30 microns.

The particulate electrically conductive material is preferably about 52-75 parts, most preferably from about 60-70 parts, by weight silver flake or a mixture of about 20-35 parts, most preferably from about 23-30 parts, by weight graphite and about 2-8 parts, most preferably from about 2.5-6 parts, of carbon black.

The solvent component of the present invention is preferably a nonhydrocarbon polar solvent which is capable of substantially dissolving the resin component and adjusting the viscosity of the curable PTF composition. The more preferred solvents include diethylene glycol monoethyl ether acetate ("carbitol acetate"); diethylene glycol monobutyl ether acetate ("butyl carbitol acetate"); diethylene glycol dimethyl ether ("diglyme"); diethylene glycol monoethyl ether ("carbitol"); and dibasic ester solvent. The most preferred is carbitol acetate.

The minimum preferred amount of solvent, when employed, is a sufficient amount to substantially dissolve the resin composition.

Preferably, the amount of solvent, if employed, is from about 15 parts to about 60 parts by weight of the curable polymer thick film composition. More preferably, the curable PTF composition may contain about 20 parts to about 50 parts by weight of carbitol acetate.

The curable PTF composition of the present invention may preferably also contain other minor ingredients. Such preferable ingredients include polymerization catalysts and flow aids.

One optional component is a polymerization catalyst. Three preferred polymerization catalysts are zinc octoate, toluene sulfonic acid, and an amine organo tin catalyst. The primary function of this catalyst is to facilitate either the reaction between the hydroxyl groups in the poly(hydroxystyrene) resin and the isocyanate ring moieties in the blocked polyisocyanate resin during the curing step or the reaction between the hydroxyl groups in the poly(hydroxystyrene) resin and the methylol ether groups in the melamine-formaldehyde resin during the curing step.

If used, the polymerization catalyst is preferably employed in amounts from about 0.05 parts to about 2 parts by weight.

Another optional ingredient, in the curable PTF composition, is a flow additive. Three preferred types of flow additives are silicon polymers, ethyl acrylate/2-ethylhexyl acrylate copolymers, and an alkylol ammonium salt of acidic phosphoric acid esters of ketoxime. Mixtures of flow agents may be employed.

If used, the flow additive is preferably employed in amounts from about 0.5 parts to about 2 parts by weight.

The components of the present conductive PTF composition may be mixed together by any conventional means. Preferably, it is desirable to first mix the poly(hydroxystyrene) resin or resins with the solvent or solvents in a conventional agitated mixing apparatus. This is preferably followed by adding the blocked isocyanate resin or melamine-formaldehyde resin and the conductive material as well as any minor preferred components to the apparatus while continuing the agitation. After the last component has been added, the agitation should be continued until a uniform mixture is obtained. This mixture may than be preferably placed in a three-roll mill or another suitable milling machine to obtain a fineness of grind of the composition of under about 30 microns.

The compositions of this invention may be applied to substrates by a variety of techniques, such as screen printing, spraying, or brushing. Once the conductive PTF composition has been applied to the substrate, it is dried and cured by exposing it and the substrate to elevated temperatures one or more times. The preferred curing, in a convection oven, is at temperatures from about 120° C. to about 150° C. for times from about 20 minutes to 90 minutes. In an infrared oven, with a phenolic paper PWB substrate, the preferred curing is at a temperature from about 180° C. to about 250° C. from about 2 minutes to about 30 minutes. Any conventional PTF curing apparatus may be used.

When the mixture of poly(hydroxystyrene) resin or resins and blocked isocyanate resin or melamine-formaldehyde resin are thermal cured, it is believed that either the blocked isocyanate groups or the methylol groups are deblocked and thus reactive with either the hydroxyl groups or the aromatic ring in the poly(hydroxystyrene) resins to form a thermoset polymer having urethane or methylene linkages. This reactive mechanism is not fully understood and the present invention should be limited to any particular reaction mechanism.

The conductive composition of the present invention may be applied to conventional rigid or flexible substrates. Whether the substrate is flexible or rigid in nature, the substrate may or may not have to be pretreated or precoated with any other substance before applying the present curable PTF compositions.

The conductive compositions of the present invention are flexible and as such, they may be applied to a flexible substrate such as, for example, polyimide films. Examples of flexible substrates that may be coated with the conductive compositions of the present invention are polyimide substrates such as that made by E. I. DuPont de Nemours Company and sold under the trademark Kapton ®. Of course, other flexible materials such as polycarbonate film or polyvinyl fluoride (PVF) film may be used as a flexible substrate.

The term "flexible" as presently employed in this specification and claims is used to mean when the composition of the present invention may be subjected to deformative forces (e.g., twisting or bending) and will not release from the substrate or crack or break. The composition, in its deformed state, will function as well as the composition in its undeformed state. The most severe form of deformation would be to put a crease in the composition. This may be accomplished by a 180 degree angle fold of the composition and substrate. A flexible composition like those of the present invention will function well under this condition. If the composition cracks or breaks as the result of being distorted, the composition would not be considered flexible; cracks in the composition cause a severe decrease in conductivity and other electrical and mechanical properties.

Phenolic paper PWB's are examples of rigid substrates.

EXAMPLES 1 AND 2

Two PTF compositions, having the components listed in Table 1, were prepared by first dissolving the polyhydroxystyrene resin in the solvent using a Cowles mixer. After the addition of one of the crosslinking resins, the conductive filler or fillers were added, and the entire mixture was roll milled until a fine uniform dispersion of less than 30 microns was achieved. A sample of each uncured mixture of Examples 1 and 2 was stored for over four (4) weeks at a temperature of about 45° C. Both samples remained stable, and no undesirable gel formation occurred. Each uncured system was then screen printed onto a phenolic resin-type printed wiring board substrate and placed into a convection oven at 140° C. for 30 minutes. The solvent resistance (i.e., number of rubs of a methylethyl ketone saturated paper towel across the cured pattern necessary to dissolve the cured dispersion) and surface resistivity (i.e., ohms per square at 1 mil) were measured. The results are summarized in Table 2. As the results illustrate, the PTF compositions of the present invention are shown to possess a long shelf life at room temperature and cure rapidly at 140° C. in convection ovens.

TABLE 1

| Component | Parts by Weight | |
|---|---|---|
| | Example 1 | Example 2 |
| Poly(hydroxystyrene) Resin | 9.2 (a-1) | 5.61 (a-2) |
| Hexamethoxymethylmelamine b | — | 3.54 |
| Blocked Isocyanante c | 21.27 | — |
| Diglyme Solvent | 36.87 | — |
| Carbitol Acetate Solvent | — | 22.52 |
| Silver Flake | — | 68.33 |
| Graphite | 26.5 | — |
| Carbon Black | 5.85 | — |
| Zinc Octoate | 0.3 | — |

(a-1) Poly(p-hydroxystyrene)-SN-5773. Available from Hoechst Celanese Corporation.
(a-2) Poly(p-hydroxystyrene)-SN-7549. Available from Hoechst Celanese Corporation.
b CYMEL 303 Melamine-formaldehyde resin. Available from American Cyanamid.
c Blocked isocyanate - Desmodur BL-3175A. Available from Mobay Corp.

TABLE 2

| Example | Surface Resistivity Ohms/Sq./Mil. | MEK Resistance |
|---|---|---|
| 1 | 50 | Excellent |
| 2 | 0.017 | Good |

EXAMPLE 3

A PTF composition having the components listed in Table 3 were prepared in the same manner as the compositions of Examples 1 and 2. This system was then screen printed onto a phenolic paper-type printed wiring board substrate and placed in an infrared oven at 185° C. for about 6 minutes. After this curing, the solvent resistance and surface resistivity were again measured. The solvent resistance was more than 100 rubs, which is good. The surface resistivity was 10.7 ohms per square at 1 mil, which is excellent.

TABLE 3

| Component | Parts by Weight |
|---|---|
| Poly(hydroxystyrene) Resin (a-3) | 13.1 |
| Hexamethoxymethylmelamine b | 8.27 |
| Carbitol Acetate | 50 |
| Graphite | 26 |
| Carbon Black | 2.62 |
| | 100.0 |

(a-3) Poly(p-hydroxystyrene)-SN-7548. Available from Hoechst Celanese Corporation.

The high-temperature, infrared curing of this PTF composition did not distort the underlying phenolic paper-type printed wiring board while the cured composition still maintained excellent electrical and physical properties.

What is claimed is:

1. A method of curing a polymer thick film on a substrate comprising the steps of:
   (1) providing a polymer thick film composition comprising, by weight:
      (a) about 3-15 parts of at least one poly(hydroxystyrene) resin; and
      (b) a crosslinking resin selected from the group consisting of:
         (i) about 5-25 parts of at least one blocked isocyanate resin; and
         (ii) about 2-10 parts of at least one melamine-formaldehyde resin;
      (c) an effective amount of at least one organic solvent capable of substantially dissolving (a) and (b) ingredients; and
      (d) a conductive material selected from the group consisting of:
         (i) about 50-80 parts silver flake; and
         (ii) an admixture of about 15-45 parts graphite and about 1-10 parts carbon black; or
         (iii) a mixture of (i) and (ii);
   (2) applying said composition to a substrate; and
   (3) curing said composition onto said substrate by exposing the coated substrate to elevated temperatures.

2. The method of claim 1, wherein said applying step 2 is a screen-printing operation.

3. The method of claim 1, wherein said curing step is carried out in a convection oven at a temperature from about 120° C. to about 150° C. for a period of time from about 90 minutes to about 20 minutes.

4. The method of claim 1, wherein said curing step is carried out in an infrared oven at a temperature from about 180°-250° C. for about 2-30 minutes.

5. The method of claim 1 wherein said solvent is at least one nonhydrocarbon polar solvent capable of dissolving the resin system, the amount of said solvent being sufficient to substantially dissolve the resin system and to adjust the viscosity of said polymer thick film composition in order to make it applicable to a substrate in the form of an electrically conductive circuitry.

6. The method of claim 5 wherein the amount of said solvent is from about 15 parts to about 60 parts by weight of said polymer thick film composition.

7. The method of claim 6 wherein said solvent is selected from the group consisting of diethylene glycol monoethyl ether; diethylene glycol dimethyl ether; dibasic ester solvent; diethylene glycol monoethyl ether acetate; and diethylene glycol monobutyl ether acetate.

8. The method of claim 7 wherein the amount of said solvent is from about 20 parts to about 50 parts by weight of said polymer thick film composition.

9. The method of claim 8 wherein said solvent is diethylene glycol monoethyl ether acetate.

10. The method of claim 1 wherein said thermally curable conductive polymer thick film composition further comprises a polymerization catalyst.

11. The method of claim 10 wherein said polymerization catalyst is selected from the group consisting of zinc octoate, toluene sulfonic acid, and an amineorgano tin catalyst system.

12. The method of claim 11 wherein said thermally curable conductive polymer thick film composition contains about 0.05 parts to about 2 parts of said polymerization catalyst.

13. The method of claim 1 wherein said thermally curable conductive polymer thick film composition further comprises a flow additive.

14. The method of claim 13 wherein said flow additive is selected from the group consisting of a silicon polymer, ethyl acrylate/2-ethylhexyl acrylate copolymer, and an alkylolammonium salt of acidic phosphoric acid esters of ketoxime and mixtures thereof.

15. The method of claim 14 wherein said thermally curable conductive polymer thick film composition contains about 0.5 parts to about 2 parts by weight of said flow additive.

16. The method of claim 1 wherein said poly(hydroxystyrene) resin is a linear poly(p-hydroxystyrene) resin having a molecular weight from about 6,000 to about 250,000.

17. The method of claim 1 wherein said blocked isocyanate resin is a blocked aliphatic isocyanate based on hexamethylene di-isocyanate.

18. The method of claim 1 wherein said melamine-formaldehyde resin is hexamethoxymethylmelamine.

19. The method of claim 1 wherein said thermally curable conductive polymer thick film comprises, by weight:
   (a) about 5-13.5 parts of at least one linear poly(p-hydroxystyrene) resin having a molecular weight from about 6,000 to about 250,000;
   (b) a crosslinking resin selected from the group consisting of:
      (i) about 8-22 parts of at least one blocked aliphatic isocyanate resin made from hexamethylene di-isocyanate;
      (ii) about 3-9 parts of a hexamethoxymethylmelamine resin;
   (c) about 20-50 parts of said carbitol acetate solvent; and
   (d) a particulated electrically conductive material selected from the group consisting of:
      (i) about 60-70 parts silver flake; or
      (ii) an admixture of about 23-30 parts graphite and about 2.5-6 parts carbon black.

* * * * *